United States Patent
Haba

[19]

[11] Patent Number: 6,126,455
[45] Date of Patent: *Oct. 3, 2000

[54] LIDLESS SOCKET AND METHOD OF MAKING SAME

[75] Inventor: Belgacem Haba, Cupertino, Calif.

[73] Assignee: Tessera, Inc., San Jose, Calif.

[*] Notice: This patent is subject to a terminal disclaimer.

[21] Appl. No.: 09/363,496

[22] Filed: Jul. 29, 1999

Related U.S. Application Data

[63] Continuation of application No. 09/112,545, Jul. 9, 1998, Pat. No. 5,951,305.

[51] Int. Cl.$^7$ .................................................. H01R 1/00
[52] U.S. Cl. ............................................................ 439/70
[58] Field of Search ............................... 439/70, 71, 66, 439/42

[56] References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,615,824 | 4/1997 | Fjelstad et al. | 228/180.1 |
| 5,632,631 | 5/1997 | Fjelstad et al. | 439/82 |
| 5,802,699 | 9/1998 | Fjelstad et al. | 29/593 |

*Primary Examiner*—T. C. Patel
*Attorney, Agent, or Firm*—Lerner, David, Littenberg, Krumholz & Mentlik, LLP

[57] ABSTRACT

A socket for use with a semiconductor chip assembly having conductive joining units such as solder balls thereon. The socket includes a flexible dielectric element such as a polyimide sheet having a plurality of apertures extending through it. A backing element disposed beneath the dielectric element has holes of slightly larger diameter than the apertures, the holes being aligned with the apertures so that a lip region of the flexible dielectric element overlies each hole. The socket also includes contacts disposed adjacent to the holes and apertures. The joining units on the chip assembly are of larger diameter than the apertures but smaller than the holes. When the chip assembly is engaged with the socket, the dielectric element deforms. The joining units pass through the apertures and are retained in engagement with the socket, and in electrical contact with the contacts of the socket, by the dielectric element.

39 Claims, 8 Drawing Sheets

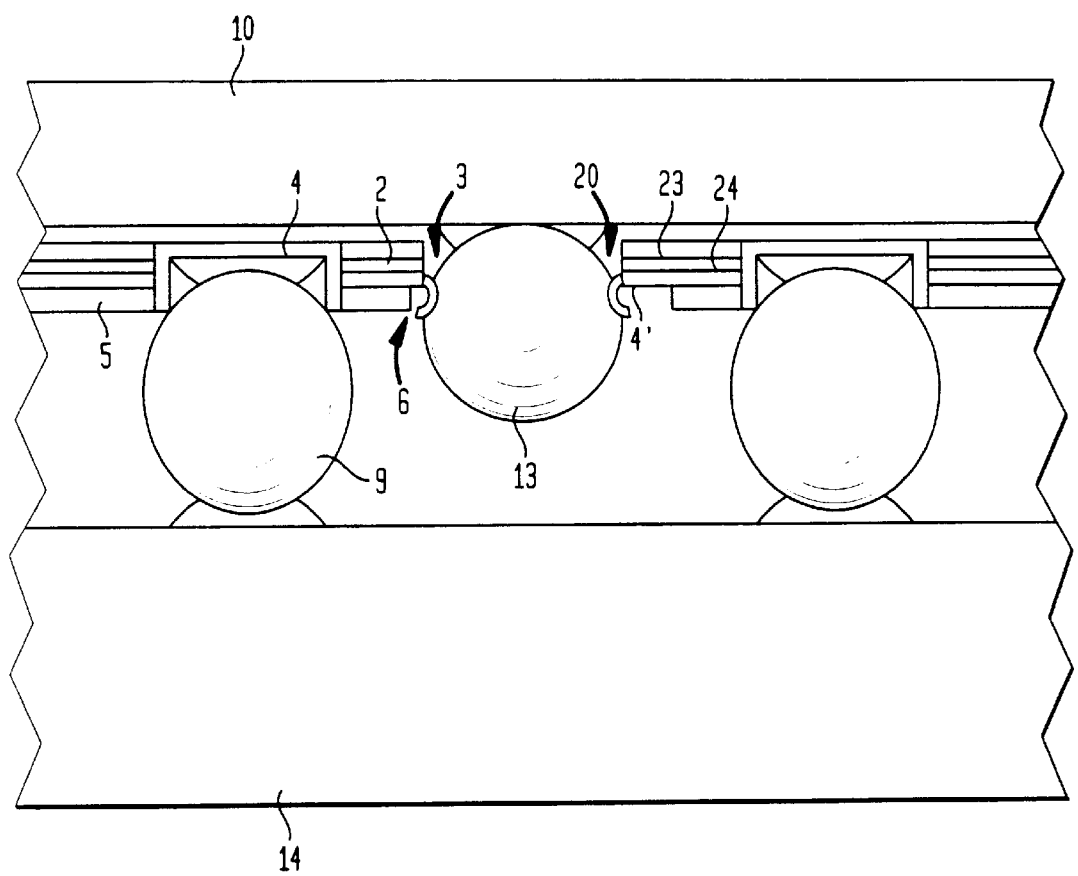

LIDLESS SOCKET AND METHOD OF MAKING SAME

The present application is a continuation of U.S. patent application Ser. No. 09/112,545 filed Jul. 9, 1998, now U.S. Pat. No. 5,951,305.

BACKGROUND OF THE INVENTION

1. Field of the Invention

The present invention relates to sockets for use in connecting semiconductor chip assemblies to substrates and the methods of making such sockets.

2. Description of the Related Art

U.S. patent application Ser. No. 08/254,991 filed on Jun. 7, 1994, now U.S. Pat. No. 5,802,699 the disclosure of which is incorporated herein, discloses a connector for mounting a microelectronic element to a substrate. In certain embodiments, the connector includes a sheet-like dielectric body having a plurality of holes, an array of resilient contacts secured to the dielectric body and an array of terminals electrically connected to the contacts.

U.S. Pat. No. 5,632,631, which issued on May 27, 1997, the disclosure of which is incorporated herein, discloses, in certain embodiments, a contact comprising a base portion and a plurality of asperities protruding upwardly from the surface of the base portion. The base portion may include a ring-like anchor region and a plurality of tabs extending inwardly from the anchor region to a common center. The asperities may be disposed on the tabs. The '631 patent also discloses a connector which includes a connector body and at least one of the contacts described above and wherein the anchor region of each contact is fixed to the connector body and the tabs are free to bend. When a mating contact element (such as a lead or solder ball) is forced against the contact, the tabs bend and the mating contact element is wiped across the asperity causing the sharp edges of the asperity to scrape the mating contacting element so that an electrical connection to the mating contact element can more easily be made.

U.S. Pat. No. 5,615,824, which issued on Apr. 1, 1997, the disclosure of which is incorporated herein, discloses a method of making an electrical connection. In a preferred embodiments, the method comprises the steps of engaging a first element having a plurality of solder masses and a second element having a plurality of resilient contacts; heating the elements so that the contacts penetrate the solder masses; and cooling the assembly. The second element may be comprised of a connector body having a plurality of holes. Each resilient contact may have one or more tabs which project over one of such holes. The tabs bend during the engaging step and spring back as the contacts penetrate the solder masses. Each contact may be covered by a solder mask made of a dielectric material that is a thermoplastic.

Certain embodiments disclosed in U.S. patent application Ser. No. 08/862,151, filed on May 22, 1997 disclose a connector for a microelectronic assembly which includes a sheetlike body having a plurality of contacts, a substrate having leads, and a support structure extending between sheetlike element and the substrate. The contacts may include several sheetlike metallic projections extending inwardly around a hole in the sheetlike element one side of the sheetlike element. A support structure, such as an array of non-collapsing structural posts is on another side of the sheetlike element. Each of the contacts is surrounded by several posts. The posts keep the sheetlike element spaced away from a substrate to which the posts are attached. The disclosure of the '151 application is incorporated herein.

Many of the sockets described in the disclosures set for above as well as many other sockets of the prior art rely upon pressure to maintain an electrical contact between the device to be tested and the contacts of the socket. A lid or other backing element is placed over the device and pressure is applied to the lid to insure that the electrical contact between the device and the contacts on the socket are maintained. Some sockets may, in the alternative or in addition, have a mechanism for engaging the sides of the chip or the device. While the above mentioned socket designs are important improvements to socket technology, further improvements are desirable.

SUMMARY OF THE INVENTION

The present invention relates to sockets for use in connecting a semiconductor chip assembly to an external substrate such as a printed circuit board. Such semiconductor chip assemblies have a plurality of electrically conductive joining units such as bumped leads or ball leads. Semiconductor chip assemblies which may be connected to an external substrate using the socket of the present invention include, for example, flip chip assemblies, ball grid arrays and assemblies, such as those disclosed in commonly assigned U.S. Pat. Nos. 5,148,265 and 5,148,266. The semiconductor chip assembly may comprise a single semiconductor chip, a plurality of semiconductor chips or wafer. The socket of the present invention can be used to permanently connect a semiconductor chip assembly to an external substrate, such as a printed circuit board; or to temporarily connect such an assembly to an external substrate, such as a test circuit board, for testing purposes. The socket of the present invention incorporates a grabbing or locking feature that is capable of capturing the joining units of the chip assembly. In certain embodiments, the socket of the present invention is lidless because it does not require a lid or any other mechanism for applying pressure to a semiconductor chip assembly in order to maintain an electrical contact between the terminals of the chip assembly and the socket.

BRIEF DESCRIPTION OF THE DRAWINGS

FIG. 6 is a side view of a socket according to another embodiment of the present invention in conjunction with a semiconductor chip assembly 10 and an external substrate 14.

DETAILED DESCRIPTION OF THE PREFERRED EMBODIMENTS

Figure 1:
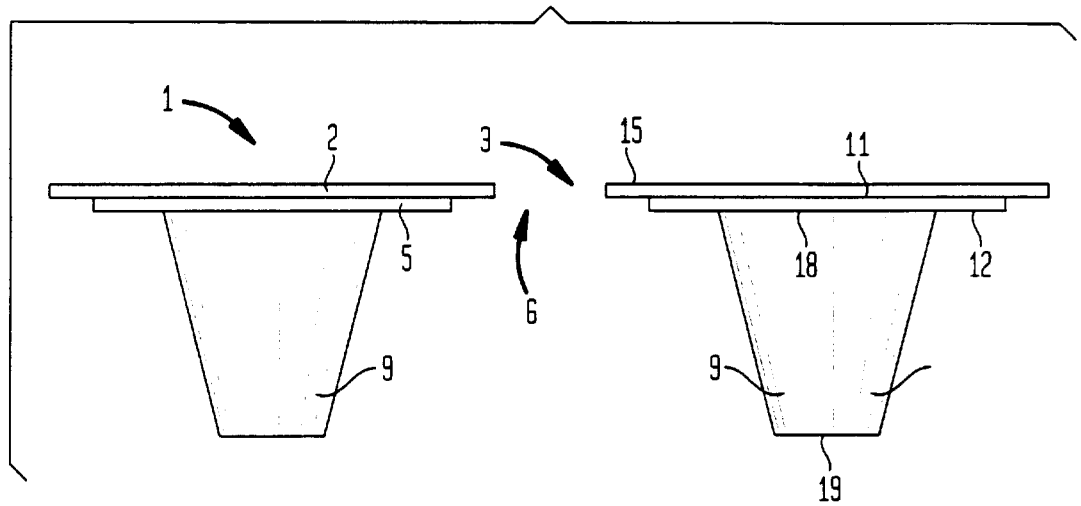
FIG. 1 is a side view of a socket according to one embodiment of the present invention.
Figure 2:
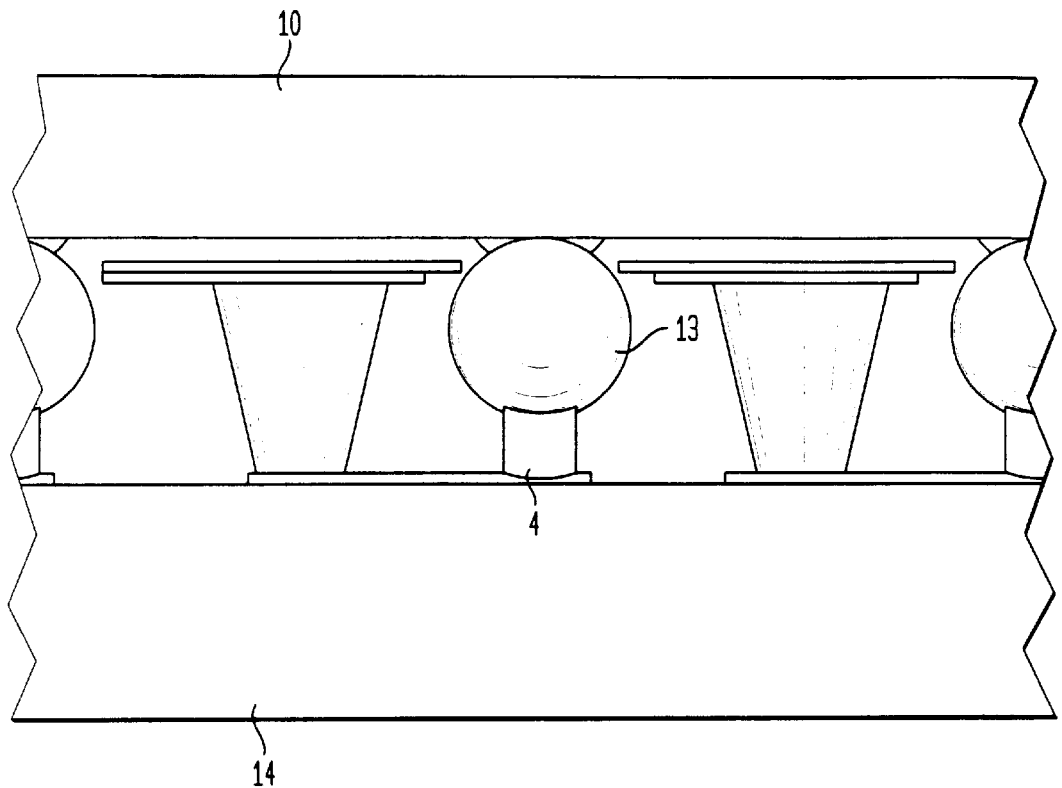
FIG. 2 is a side view of the socket of FIG. 1 shown in conjunction with a semiconductor chip assembly and an external substrate.

The present invention relates to sockets for use in connecting a semiconductor chip assembly having a plurality of electrically conductive joining units to an external substrate. The socket of the present invention incorporates a grabbing or locking feature that is capable of capturing the joining units of the chip assembly when such joining unit is inserted into an aperture in the socket. A portion of a socket according to one embodiment of the present invention is depicted in FIG. 1. Socket 1 includes a flexible dielectric element 2 having a plurality of apertures 3 and a backing element 5 disposed beneath flexible dielectric element 2. Backing element 5 has a plurality of holes 6. Each hole is aligned with one of the apertures in the flexible dielectric element. Backing element 5 also has a first surface 11, and a second surface 12 opposite the first surface. Holes 6 extend from the first surface 11 to the second surface 12. Surrounding each aperture 3 is a lip 15. By the term "lip" it is meant the area immediately adjacent to and surrounding an aperture. Each lip 15 is that portion of flexible element 2 that overhangs the hole 6 which is disposed under an aperture 3. The socket may also comprise a plurality of spacers 9 disposed beneath backing element 5. In preferred embodiments, the alpha surfaces of spacers 9 are connected to the backing element 5. Spacers 9 may be adapted to join the socket to an external substrate and may be comprised of a rigid, semi-rigid or compliant material. FIG. 2 depicts the socket of FIG. 1 in conjunction with a semiconductor chip assembly and an external substrate.

Figure 1A:
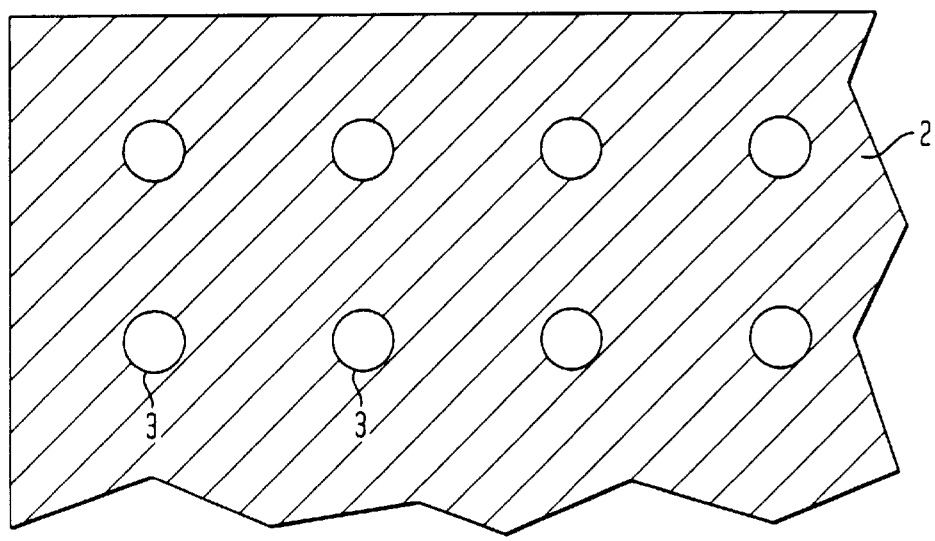
FIG. 1A is a top view of a portion of a socket according to another embodiment of the present invention.
Figure 1B:
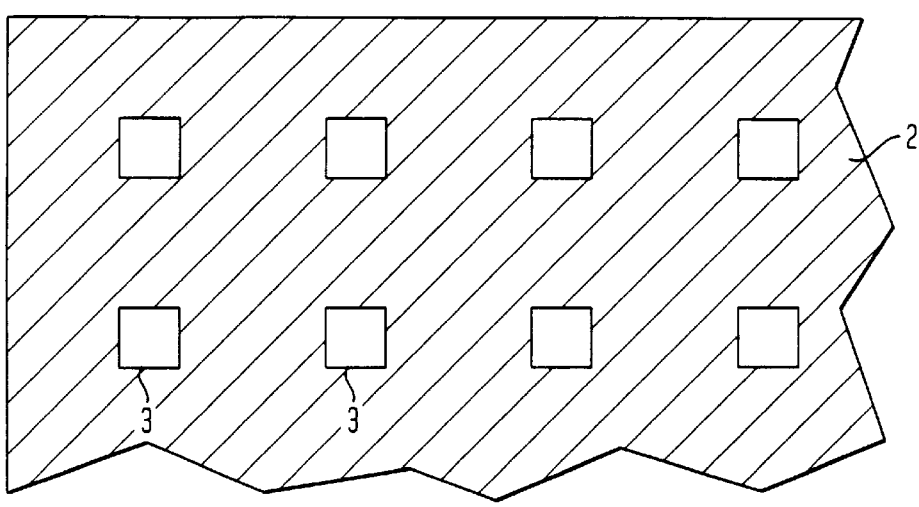
FIG. 1B is a top view of a portion of a socket according to another embodiment of the present invention.
Figure 1C:
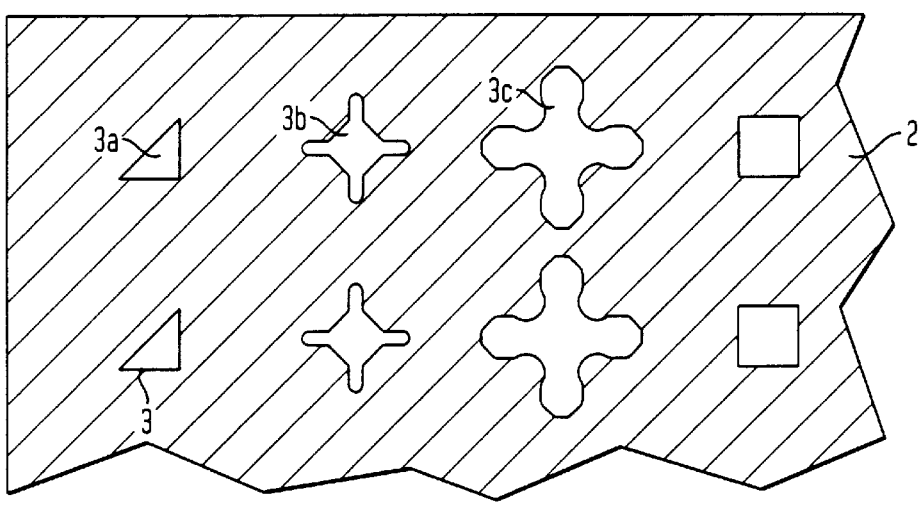
FIG. 1C is a top view of a portion of a socket according to another embodiment of the present invention.

As depicted in FIG. 1, flexible dielectric element 2 has a top surface and a bottom surface opposite the top surface. Each of the plurality of apertures extends from the top surface to the bottom surface. Each lip 15 is preferably integral with flexible dielectric element 2. In preferred embodiments, the top surface of each lip is co-planar with the top surface of flexible dielectric element and the bottom surface of each lip is co-planar with the bottom surface of the flexible dielectric element. The aperture may have any shape, including circular, semicircular, triangular, square, rectangular, or any other geometric or arbitrary shape for capturing a joining unit of a semiconductor chip assembly. For example, FIGS. 1A, 1B, and 1C show top plan views of portions of sockets according to various embodiments of the present invention. The apertures depicted in FIG. 1A are circular. The apertures in FIG. 1B are square and the apertures of FIG. 1C have various shapes. In FIG. 1C, aperture 3a has a triangular cross-sectional shape. Apertures 3b and 3c have fingerlike projections that extend radially. In other words, the region of the flexible dielectric element that defines each aperture includes a plurality of finger-like projections, the tips of which extend inwardly towards a common center. Such finger-like projections are preferred because they allow the lip of each aperture to more easily deflect so that a solder ball can pass through the aperture. In preferred embodiments, all the apertures in a socket are uniform.

The effective diameter of each aperture in the flexible dielectric element should be smaller than the diameter of the electrically conductive joining unit that will be inserted into the aperture. For example, if the joining unit is a solder ball, the effective diameter of the aperture should be less than the diameter of the solder ball. By the term "effective diameter" we mean the diameter of the largest circle which will fit within the aperture without touching the sides of the aperture. In preferred embodiments, the geometric center of this circle will be generally aligned with the geometric center of the aperture. In preferred embodiments, the effective diameter of each aperture is from 1 to 10 mils smaller, more preferably, 3 to 5 mils smaller, than the diameter of the electrically conductive joining unit that will be inserted into the aperture. Although the apertures may be randomly arranged, in preferred embodiments, apertures 3 are arranged in a grid-like array and have a constant center—center distance, or pitch, of 250 μm to 1500 μm.

Figure 1D:
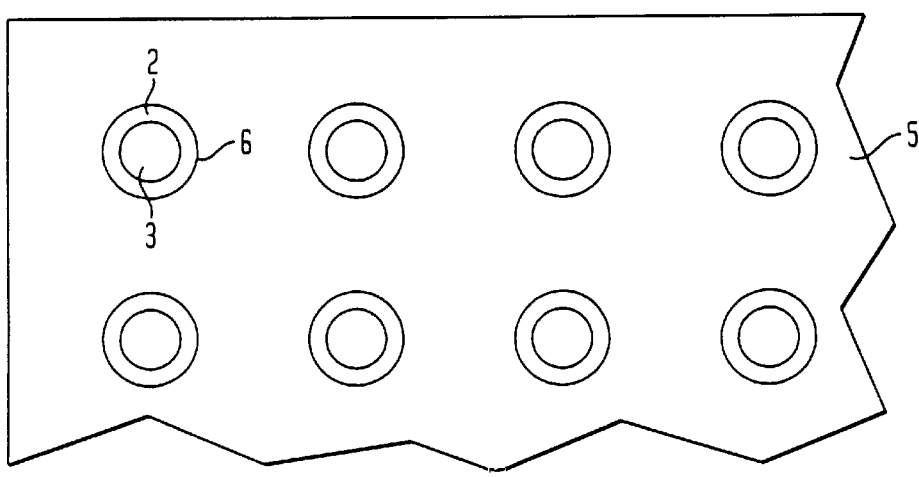
FIG. 1D is a bottom view of the socket depicted in FIG. 1A.
Figure 1E:
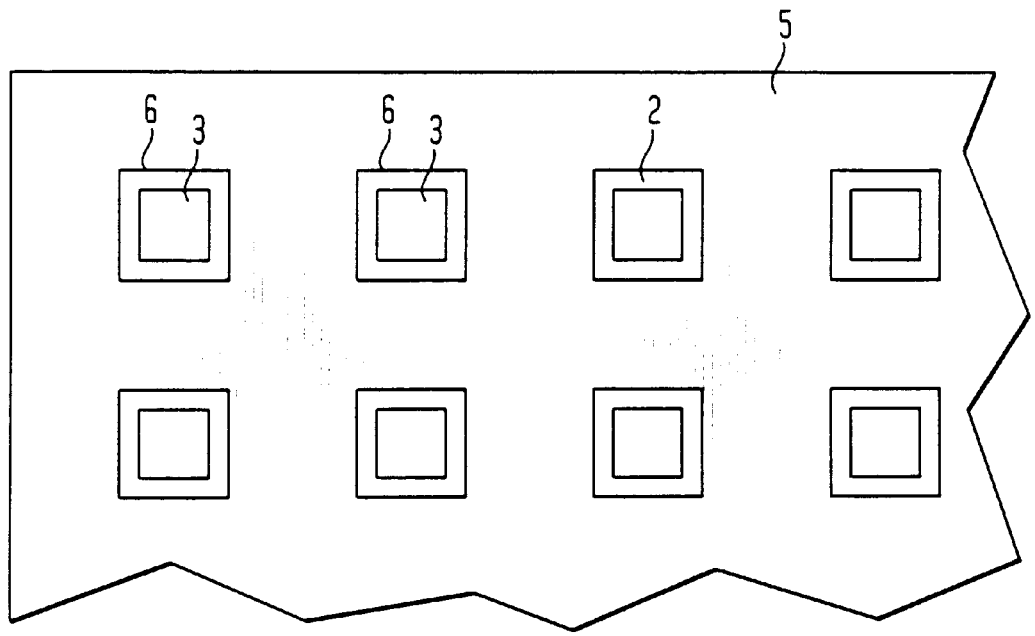
FIG. 1E is a bottom view of the socket depicted in FIG. 1B.
Figure 1F:
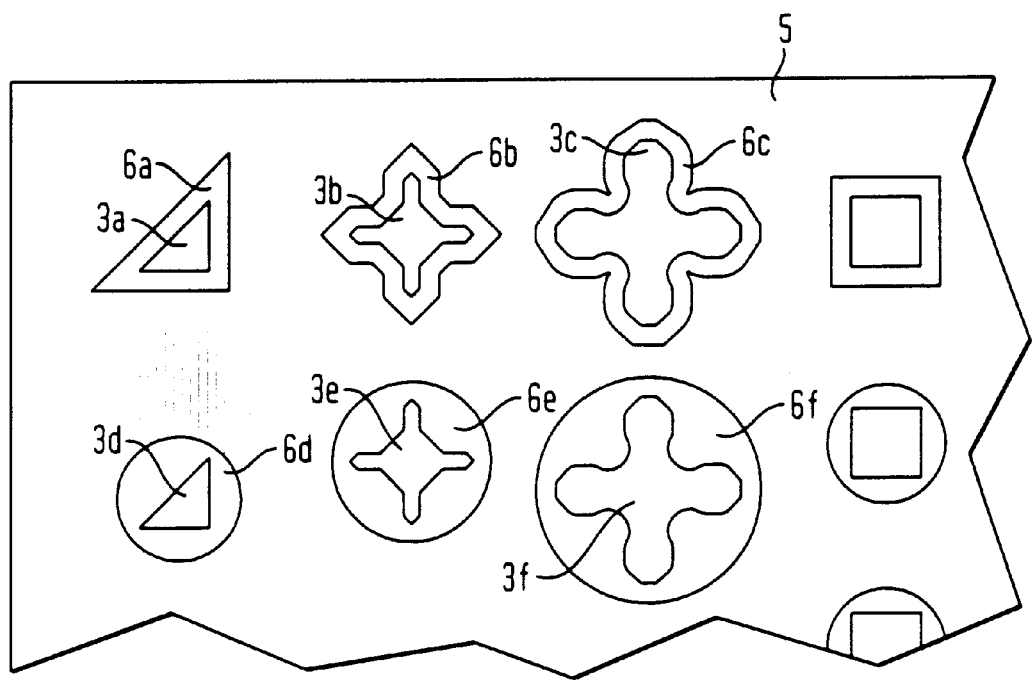
FIG. 1F is a bottom view of the socket depicted in FIG. 1C.

The first surface 11 of backing element 5 is connected to the bottom surface of flexible dielectric element 2. Each of the holes 6 should be aligned with one of the apertures 3. Just as each aperture maybe any shape, each hole may also be any shape. For example FIGS. 1D, 1E, and 1F show bottom plan views of portions of sockets according to various embodiments of the present invention. The holes 6, as well as the apertures 3, depicted in FIG. 1D are circular. In FIG. 1E, both the holes 6 and the apertures 3 are square. In FIG. 1F, the shapes of hole 6a and aperture 3a are triangular. Holes 6b and 6c, and apertures 3b and 3c, have finger-like projections that extend radially. It is not necessary that a hole and the aligned aperture have the same shape. For example, in FIG. 1F, holes 6d, 6e and 6f are circular while aperture 3d is triangular, and apertures 3e and 3f have finger-like projections. Each aperture will normally be smaller than the aligned hole.

In preferred embodiments, the shape of each hole is circular. The diameter of each hole should be larger than the diameter of the electrically conductive joining unit that will be inserted through the aperture and the aligned hole. If the diameter of the hole is too large, then the backing element may not provide sufficient support for the flexible dielectric element and the entire flexible dielectric element will tend to deflect, rather than just the lip portion, when the joining unit is pressed against the flexible dielectric element. If the diameter of hole 6 is too small in relation aperture 3, the lips may not be flexible enough to deflect to allow the joining units to penetrate the apertures. Because the holes are larger than the joining units, the socket can accommodate semiconductor chip assemblies having some misalignment in joining unit placement and some variation in joining unit size. In preferred embodiments, the diameter of each hole is 1 to 10 mils larger, more preferably 3 to 5 mils larger, than the diameter of the electrically conductive joining unit that will be inserted into the hole. In preferred embodiments, the electrically conductive joining unit will be a solder ball, a solid core solder ball or a bumped lead. Such electrically conductive joining units typically have diameters of 5 to 50 mils. In preferred embodiments, such joining units have diameters of 10 to 30 mils. The size of lips 15 and the flexibility of the flexible dielectric element may be varied to modify the lip resistance to an inserted joining unit.

Each of the plurality of spacers 9 has an alpha surface 18, and a beta surface 19 opposite the alpha surface. The alpha surface 19 is disposed beneath the second surface 12 of the backing element 5. In preferred embodiments, alpha surface 18 is adhered to second surface 12 of backing element 5. In order to provide additional support for flexible dielectric element 2, to allow each lip region 15 to deflect, and to minimize deflection of the rest of the flexible dielectric element, each spacer 9 is preferably located adjacent to one of the apertures but outside the lip region. The spacer may be comprised of a conductive or non-conductive material. If the spacer is comprised of a conductive material, it may be referred to hereinafter as an electrically conductive post. In preferred embodiments, the spacer is comprised of a compliant material. Preferred compliant materials include silicone gels, silicone elastomers and flexiblized epoxies. The plurality of spacers or plurality of electrically conductive posts may be replaced with a sheet or slab of material having a plurality of voids that are aligned with the apertures and holes. Alternatively, each spacer or electrically conductive post may be comprised of a solder ball or a solid core solder ball. In addition to serving as an electrical interconnection between the socket and an external substrate, the posts may also provide additional structural support for the apertures in the flexible dielectric element. In preferred embodiments of the socket of the present invention, the socket includes a plurality of electrically conductive posts that are disposed near the apertures in the flexible dielectric element. When a bumped lead or a solder ball is pressed against each aperture, the posts allow the lips of the flexible dielectric element to deflect but minimize the deflection in the rest of the dielectric element. If the entire flexible dielectric element deflected, the solder ball or bumped lead would be less likely to penetrate the aperture.

The socket of this embodiment of the present invention may be used in conjunction with an external substrate 14 having a plurality of electrically conductive contacts 4. FIG. 2 depicts the socket of FIG. 1 in conjunction with a semiconductor chip assembly and an external substrate. Semiconductor chip assembly 10 may be any type of assembly having a plurality of electrically conductive joining units 13. Semiconductor chip assembly 10 may be, for example, a flip chip assembly, a ball grid array package or any similar assembly. The joining units may be; for example, bumped leads, solid core solder balls, or solder balls. The joining units 13 depicted in FIG. 2 are solder balls. The beta surfaces 19 of spacers 9 are juxtaposed to the top surface of external substrate 14. Beta surfaces 19 may be adhered or otherwise connected to the top surface of external substrate 14. External substrate 14 has a plurality of electrically conductive contacts 4 disposed on it top surface. The contacts 4 should be aligned with the apertures 3 of the flexible dielectric element 2 and the holes 6 of the backing element 5. External substrate 14 may be comprised of a rigid or compliant material. A temporary electrical connection between a semiconductor chip assembly 10 and a test circuit board may be made using the socket of the present invention, if, for example, external substrate 14 is a test circuit. A permanent electrical connection between a semiconductor chip assembly 10 and a printed circuit board may also be made using the socket of the present invention, if for example, the external substrate 14 is a printed circuit board.

If a temporary electrical connection is made, the socket of the present embodiment of the invention is juxtaposed or connected to a test circuit having a plurality of electrically conductive contacts. The beta surfaces 19 of each spacer 9 are juxtaposed with, or preferably connected to, the test circuit or substrate 14. A semiconductor chip assembly 10 having a plurality of electrically conductive joining units 13 such as solder balls is inserted into the socket. Each solder ball 13 presses against a lip region 15 of the flexible dielectric element 2. The backing element 5 and spacer 9 support the flexible dielectric element 2 and minimize its deflection, except in the lip regions. Each lip region deflects and allows the solder ball 13 to penetrate into and pass through each aperture 3. Once the largest cross-sectional portion or the "equator" of the solder ball 13 passes the tip of each lip region, the lip region springs back. The solder ball 13 penetrates into and through the hole 6 in the backing element 5 and is locked into place by the resilience of the lip region engaging the solder ball on one side and the engagement of the solder ball and a contact surface on the opposite side. The solder ball touches a contact on the test circuit and is thereby electrically interconnected to the test circuit. The semiconductor chip assembly can then be electrically tested. The testing procedure may take less than a second or may be extended for days or weeks or even longer. Extended testing frequently includes thermal cycling. The flexibility of the socket allows it to compensate for differences in the temperature-induced expansion and contraction of the components of the semiconductor chip assembly and the test circuit that will occur in such thermal cycling. The semiconductor chip assembly is then removed from the socket. Another semiconductor chip assembly may then be tested using the socket and test circuit.

To make a permanent connection, the socket described above is connected to a printed circuit board such that the beta surfaces 19 of the spacers 9 are connected to a printed circuit board or other circuitized external substrate. The semiconductor chip assembly is inserted into the socket as described above. The electrically conductive joining units of the chip assembly are reflowed to bond the joining units to the printed circuit board. The chip assembly may be tested prior to the reflow step to insure that the semiconductor chip assembly is functioning properly. If the semiconductor chip assembly is defective, it can be removed from the printed circuit board and another semiconductor chip assembly can be connected to the printed circuit board using the same socket.

In preferred embodiments of the present invention, the height of each spacer is uniform. The height of each spacer, as measured from the alpha surface to the beta surface, plus the height of the flexible dielectric layer and the backing element should be about equal to the height of the one electrically conductive joining unit plus the height of the contact disposed on the external circuit.

Figure 3:
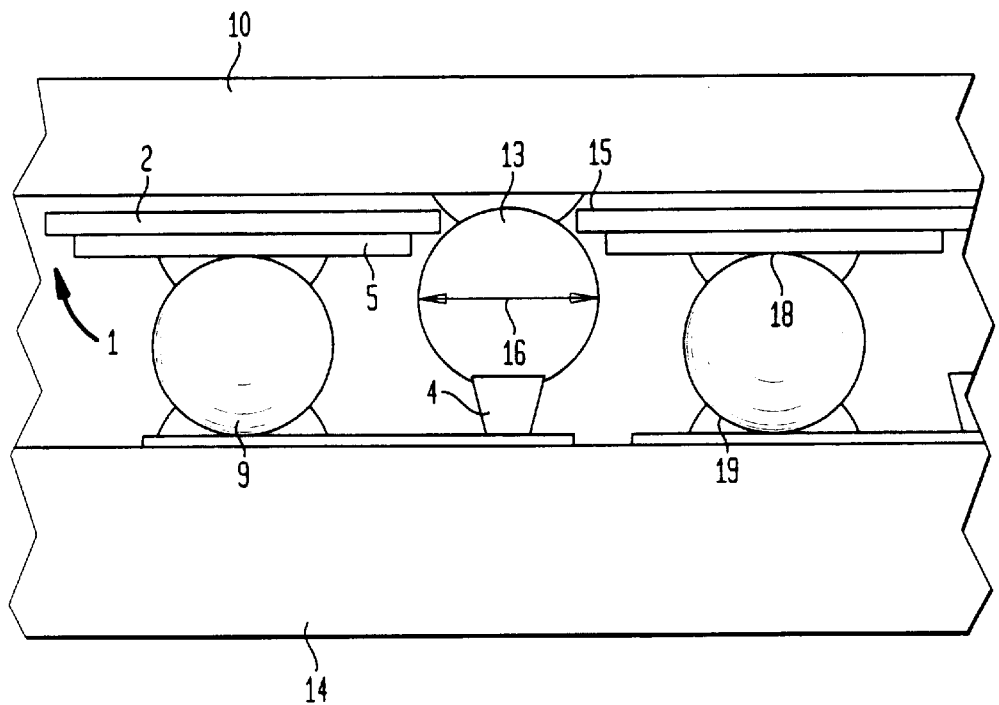
FIG. 3 is a side view of the another embodiment of the socket of the present invention in conjunction with a semiconductor chip assembly and an external substrate.

FIG. 3 depicts a socket of another embodiment of the present invention in conjunction with a semiconductor chip assembly 10 and an external substrate 14. In the socket depicted in FIG. 3, the compliant spacers have been replaced with a plurality of electrically conductive posts 9, and each post 9 is a solder mass, such as a solder ball. Each solder mass 9 has an alpha surface 18, which is connected to the backing element 5, and a beta surface 19 opposite the alpha surface. External substrate 14 has a plurality of electrically conductive contacts 4 disposed on its top surface. Semiconductor chip assembly 10 has a plurality of electrically conductive joining units 13. Each of the electrically conductive joining units 13 is aligned with one of the apertures 3 of flexible dielectric element 2. The joining units depicted in FIG. 3 are solder balls. Each solder ball 13 has an equator 16. The equator is that section of the solder ball 13 having the largest circumference. In order to test semiconductor chip assembly 10, or to connect assembly 10 to external substrate 14, assembly 10 is pressed against socket 1 such that each solder ball 13 is forced against one of the apertures 3. The lips 15 of each aperture 3 are deflectable and allow the solder ball 13 to penetrate and pass through the aperture 3 and then the underlying hole 6. As the equator 16 of each solder ball 13 passes through one of the apertures 3, each lip 15 deflects back into its original position.

Figure 4:
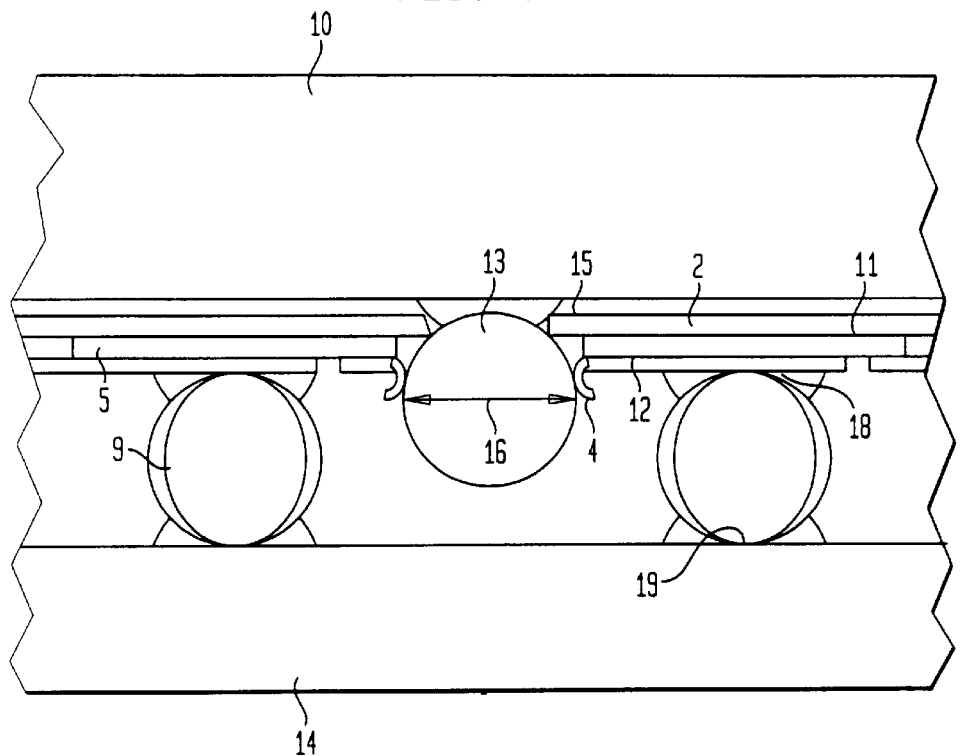
FIG. 4 is a side view of a socket according to another embodiment of the present invention in conjunction with a semiconductor chip assembly and an external substrate.

In another embodiment of the present invention, and as depicted in FIG. 4, the socket of the present invention may also include a plurality of electrically conductive contacts. FIG. 4 depicts a socket in conjunction with a semiconductor chip assembly 10 and an external substrate 14. The socket comprises a flexible dielectric element 2 having a plurality of apertures 3. A backing element 5 is disposed beneath the flexible dielectric element 2. Backing element 5 has a first surface 11, a second surface 12 opposite first surface 11 and a plurality of holes 6 extending from the first surface 11 to the second surface 12. Holes 6 are aligned with apertures 3. Socket 1 also has a plurality of electrically conductive contacts 4 disposed on the second surface 12 of backing element 5. Semiconductor chip 10 has a plurality of electrically conductive joining units 13. The beta surfaces 19 of spacers 9 are connected to the top surface of the external substrate 14. Each of the spacers 9 depicted in FIG. 4 includes a solid core solder ball.

Flexible dielectric element 2 has a top surface, a bottom surface opposite the top surface, a plurality of apertures 3 that extend from the top surface to the bottom surface, and a lip 15 surrounding each aperture. Such apertures and lips are described above. The apertures are aligned with the solder balls or bumps 13 which are disposed on the semiconductor chip assembly to be tested using the socket. The effective diameter of each aperture is slightly smaller than the diameter of the solder ball, preferably 1 to 10 mils smaller, more preferably 3 to 5 mils smaller. The backing element 5 has a first surface 11, a second surface 12 opposite the first surface and a plurality of holes 6 that extend from the first surface to the second surface. The first surface of the backing element is disposed under the bottom surface of the flexible dielectric element. In preferred embodiments, the first surface of the backing element is laminated to the bottom surface of the flexible dielectric element. Each hole 6 is aligned with one of the apertures 3. The diameter of each hole is larger than the diameter of the aligned aperture. The diameter of each hole is larger than the diameter of the joining unit which will be inserted into the hole and aligned aperture. In preferred embodiments, the effective diameter of each hole 6 is 1 to 10 mils larger, preferably 3 to 5 mils larger, than the diameter of solder ball 13. The lip of each aperture must be deflectable to the extent that when a solder ball is pressed against the aperture, the lip will deflect inwardly (toward the backing element) and will allow the solder ball to penetrate through the aperture. After a significant portion of the solder ball has penetrated the aperture, the lip will tend to rebound back to its original orientation, thus locking the solder ball into place. The solder ball or bumped lead is thereby captured by the socket and it is unlikely that the solder ball or bumped lead will be inadvertently displaced from the socket. The lip tends to rebound once the "equator" of the solder ball has penetrated the aperture. The equator of the solder ball is typically about halfway between the top and bottom of the solder ball. Each aperture and each hole may be any shape. As mentioned above, in preferred embodiments, the region of the flexible dielectric element that defines each aperture includes a plurality of finger-like projections, the tips of which extend inwardly towards a common center. One reason such apertures are preferred is because such finger-like projections form relief zones which facilitate the deflection of the lips when a solder ball is pressed against an aperture. In preferred embodiments of the present invention, the flexible dielectric element has a plurality of aperture defining regions each of which includes at least one relief zone.

The cross sectional area of each of the holes of the backing element may take any shape, including any of the shapes listed for the apertures. The general shape of each hole may be the same as, similar to or different from the shape of the aligned aperture. In preferred embodiments, the cross-sectional area of each hole is circular. Each contact should be positioned such that an electrical connection can be made between solder ball 13 and contact 4. Preferably, contact 4 wipes against solder ball 13 as it penetrates aperture 3 and hole 6. Although the present invention is not limited by any theory of operation, it is believed that the wiping action tends to rupture the film or layer of oxide which may be present on the surface of the solder ball and thus facilitates an electrical connection between the contact and the solder ball. In preferred embodiments, each aperture has a central opening and is disposed on the backing element such that the central opening is aligned with one of the holes 6 and apertures 3. Each central opening should be sized and shaped to allow a solder ball 13 to penetrate such central opening and wipes against the surface of such solder ball. The shape of each central opening is preferably similar to, and more preferably co-extensive with, the aligned aperture 3.

In preferred embodiments the flexible dielectric element is from 25 to 100 $\mu$m thick. The flexible dielectric element is preferably comprised of polyimide. The backing element may be comprised of a flexible or a rigid material. In preferred embodiments, the backing element is comprised of a material selected from the group consisting of reinforced and unreinforced plastics and dielectric coated metals. Preferred reinforced plastics include fiberglass reinforced epoxies, such as, for example, FR-4. Preferred unreinforced plastics include polyimides. If the socket of the present invention comprises contacts which are disposed on the flexible dielectric element or the backing element, the spacers 9 should be electrically conductive. Such electrically conductive spacers may be comprised of, for example, solid core solder balls, solder balls, or an electrically conductive elastomeric material such as an electrically conductive silicone or epoxy.

The electrically conductive contacts may be disposed on the top and bottom surfaces of the flexible dielectric element; the second surface of the backing element; or the second surface of the backing element and at least one of the top and bottom surfaces of the flexible dielectric element. In preferred embodiments, the contacts are disposed on at least the second surface of the backing element. If the contacts are disposed on the top surfaces of the flexible dielectric element, contacts should also be disposed on the bottom surface to insure that the electrical connection can be maintained as the joining units penetrates the aperture, and vice versa. In preferred embodiments, the contacts are comprised of gold, copper, alloys thereof, or combinations thereof. The contacts are preferably 10 to 100, more preferably 10 to 50, microns thick. Each electrically conductive contact has a chip-assembly-end and a substrate-end. If the contact is disposed on the flexible dielectric element, the chip-assembly-end of each contact should be disposed adjacent to the aperture such that the contact will wipe against the solder ball when it is pressed into the aperture. If the contact is disposed on the backing element, the chip-assembly-end of each contact should be disposed at or over each hole such that the contact will wipe against the solder ball when it is pressed through the aperture and the hole. The substrate-end of each contact must be adapted to connect to an external substrate.

Figure 5:
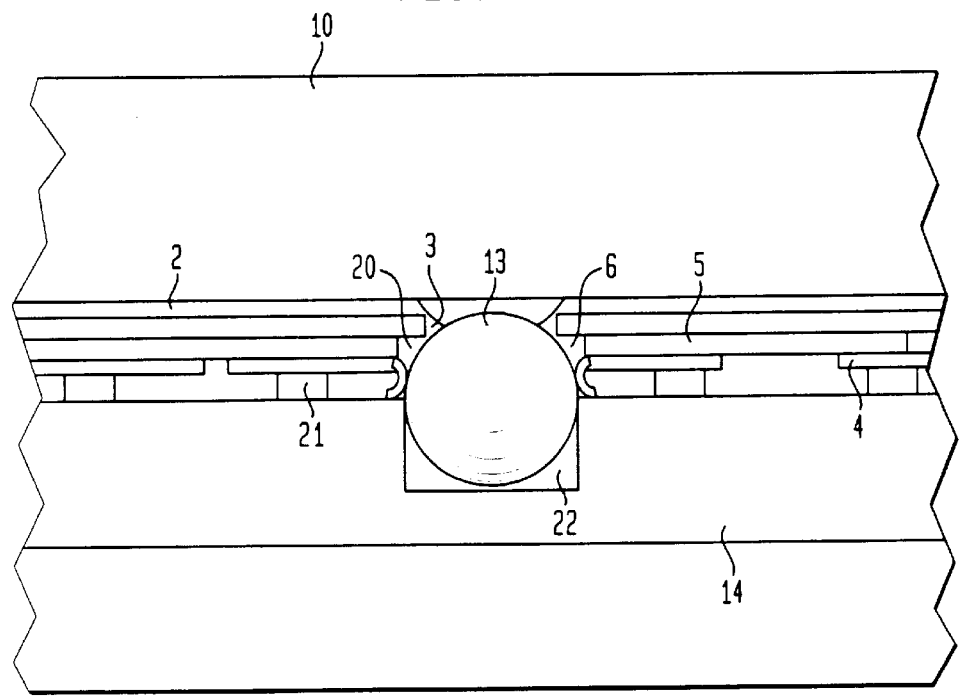
FIG. 5 is a side view of a socket according to another embodiment of the present invention in conjunction with a semiconductor chip assembly and a printed circuit board.

FIG. 5 depicts a socket of another embodiment of the present invention in conjunction with a semiconductor chip assembly 10 and a printed circuit board 14. The socket of FIG. 5 is similar to the socket of FIG. 4 except that the socket of FIG. 5 does not have a plurality of spacers disposed beneath the contacts 4. The printed circuit board 14 has a plurality of depressions 22, each of which is aligned with one of the solder balls 13. Board 14 also has a plurality of electrically conductive contact pads 21 disposed on it top surface. Each contact 4 is may be electrically interconnected to one of the contact pads 21. Each contact 4 may be a ring-like structure disposed around the holes 6 and having a central opening 20. In preferred embodiments, a portion of each ring-like contact extends beyond the edge of hole 6 and each central opening 20 is co-extensive with the aligned aperture 3. In particularly preferred embodiments, the ring-like contacts 4 are electrically conductive and are typically comprised of a metal such as copper, gold, alloys thereof or combinations thereof FIG. 6 depicts a socket according to another embodiment of the present invention in conjunction with a semiconductor chip assembly 10 and an external substrate 14. The socket of FIG. 6 has a plurality of top contacts 4 disposed on the top surface 23 of flexible dielectric element 2. The socket also has a plurality of bottom contacts 4' disposed on the bottom surface 24 of flexible dielectric element 2. Each top contact 4 is electrically connected to one of the bottom contacts 4'. Such electrical interconnection may be made, for example, with a plated via extending through flexible dielectric element 2 and backing element 5. Assembly 10 has a plurality of electrically conductive joining units 13. Each conductive post 9 is electrically connected to a circuit disposed on external substrate 14.

In an alternative embodiment, portions of each contact 4 may be disposed on the top surface, the bottom surface and the interior of flexible dielectric element 2. Portions of such contacts may also be disposed on the first surface, the second surface and/or the interior of backing element 5. If any portion of contact 4 is disposed on the top surface 23 of flexible dielectric element 2, an insulative material, such as a solder mask or other dielectric material may need to be disposed between the top surface 23 and the semiconductor chip assembly to avoid a short.

Figure 7A:
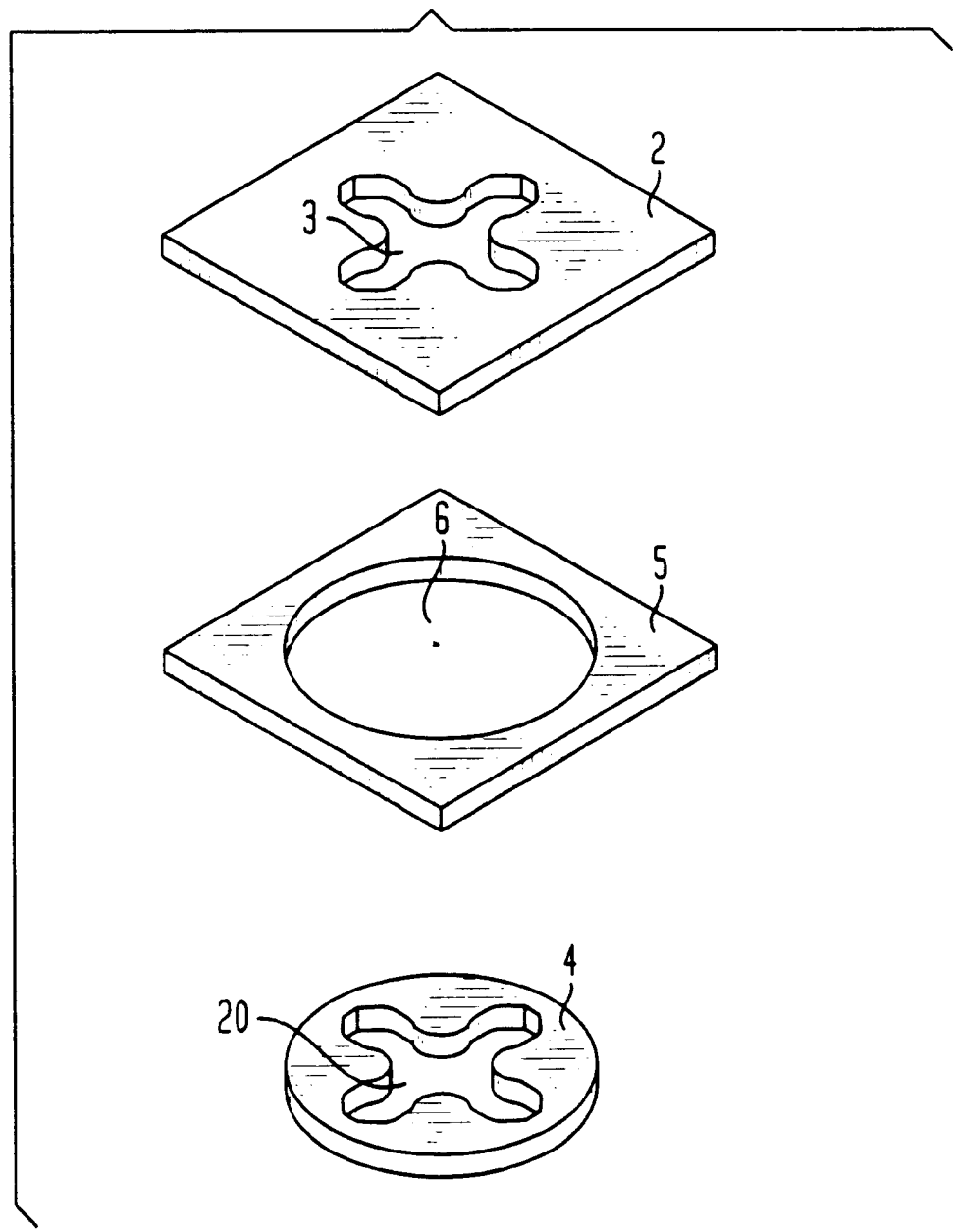
FIG. 7A is an exploded perspective view of a portion of a socket according to another embodiment of the present invention.
Figure 7B:
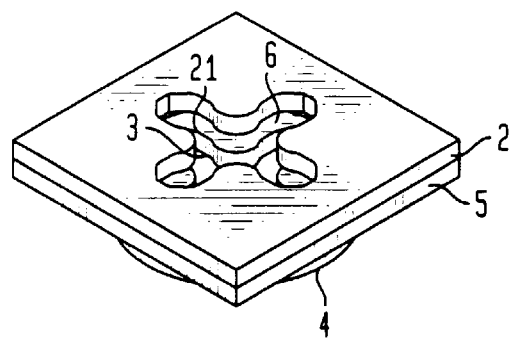
FIG. 7B is a perspective view of the socket of FIG. 7A.

FIG. 7A is an exploded perspective view of a portion of a socket of the present invention. FIG. 7A depicts a flexible dielectric element 2 having an aperture 3. A backing element 5, having a hole 6, is disposed beneath the flexible dielectric element 2. A contact 4 having a central opening 20 is disposed beneath backing element 5. The geometric centers of aperture 3, hole 6 and central opening 20 are aligned. Aperture 3 is in the shape of a plurality of finger-like projections extending from a common center. Hole 6 is circular and central opening 20 is in same shape and size as aperture 3. FIG. 7B depicts a portion of a socket of the present invention wherein the components described above with respect to FIG. 7A are in their normal orientation. Contact 4 is disposed on the second surface of backing element 5 and flexible dielectric element 2 is connected to the first surface of backing element 5. A socket of the present invention will normally have a plurality of such contacts. A bottom plan view of a portion of such socket having a plurality of contacts is depicted in FIG. 7C.

Figure 7C:
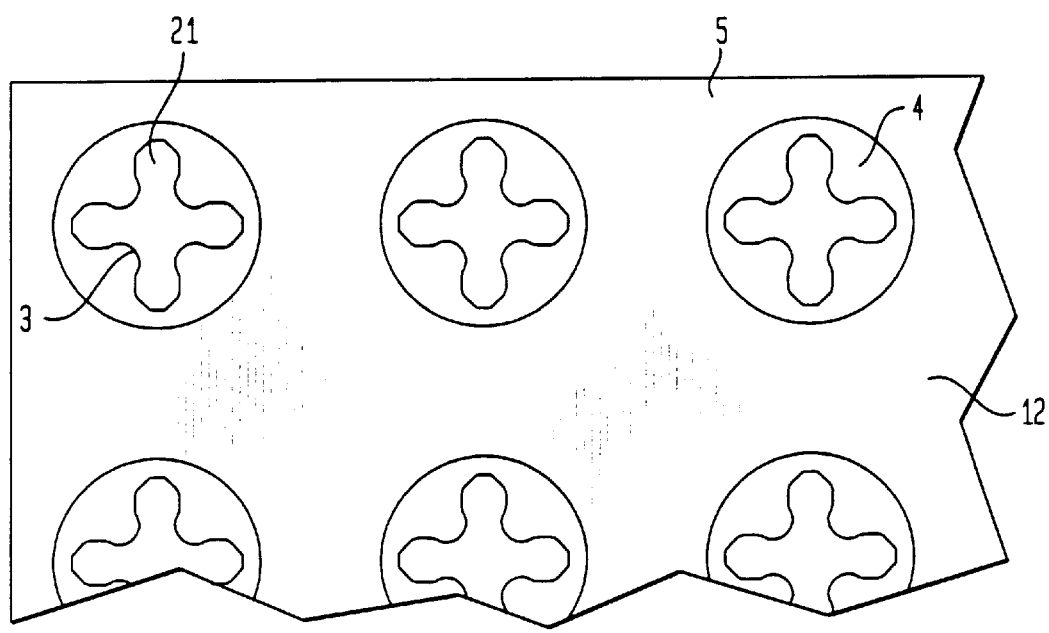
FIG. 7C is a bottom view of the socket of FIG. 7B.

FIG. 7C is a bottom view of a portion of a socket of the present invention that depicts a preferred configuration for the apertures 3 and contacts 4. Backing element 5 has a plurality of holes 6, which extend from its first surface (not shown), to its second surface 12. A plurality of contacts 4, each having a central opening 20, is disposed on the second surface 12. A flexible dielectric element (not shown), having a plurality of apertures 3, is disposed on the first surface of the backing element 5. The geometric center of each central opening 20 is preferably aligned with the geometric center of one of the holes and one of the apertures 3 of backing element 5. Each aperture is shaped like a plurality of finger-like projections that extend from a common center. The outer periphery of each contact is circular. The central opening of each contact has a shape and a size that is the same as the shape and the size of the aligned aperture.

When the socket of the present invention includes electrically conductive posts, such posts may be connected to an external substrate, such as a printed circuit board, to form a testing device or a sub-assembly. If a testing device is formed, a semiconductor chip assembly can be temporarily connected to such connection component to test the electrical properties of the assembly. After testing the semiconductor chip assembly can be permanently connected to the connection component. In preferred embodiments of the testing device, the device includes a plurality of sockets of the present invention so that a plurality of semiconductor chip assemblies can be tested simultaneously. If a sub-assembly is formed, the connection component may be used as an adapter to connect a semiconductor chip assembly having a set of electrically conductive connection points to an external substrate, such as a printed circuit board, having a different arrangement of electrically conductive connection points. In either case, the substrate-end of each contact is connected to one of the electrically conductive posts. As these and other variations and combinations of the features discussed above can be employed, the foregoing description of the preferred embodiments should be taken by way of illustration rather than as limiting the invention.

That which is claimed is:

1. A socket for use in making connection with a semiconductor chip assembly, having a plurality of electrically conductive joining units connected thereto, said socket comprising:

A. a flexible dielectric element having a top surface and a bottom surface opposite the top surface and a plurality of apertures extending from the top surface to the bottom surface and a lip region surrounding each of the apertures;

B. a backing element having a first surface, a second surface opposite the first surface and a plurality of holes extending from the first surface to the second surface, said backing element being disposed beneath the flexible dielectric element such that the first surface faces towards the bottom surface of the flexible dielectric element; and wherein each of the holes is disposed under and associated with one of the apertures in the flexible dielectric element and has an effective diameter which is greater than the effective diameter of the associated aperture, such that the lip region surrounding each aperture overlies the hole in the backing element associated with such aperture; and C. a plurality of electrically conductive contacts attached to the backing element, each said contact being adapted to make an electrical interconnection to one of the electrically conductive joining units when such electrically conductive joining unit is inserted into one of the apertures and each said contact having an opening disposed under one of the holes; and wherein the lip regions of said dielectric element surrounding each of said apertures is deflectable to the extent necessary to allow an electrically conductive joining unit having a diameter larger than the effective diameter of the aperture to penetrate through the aperture and to capture the electrically conductive joining unit after it has penetrated the aperture.

2. An assembly including the socket of claim 1 and a semiconductor chip assembly having joining units thereon assembled with said socket, the joining units of said semiconductor chip assembly being engaged in said holes and apertures.

3. The assembly of claim 2, wherein each of the joining units has a diameter of less than or equal to 30 mils, and each of the apertures has an effective diameter that is 1–10 mils less than the diameter of the joining units.

4. The socket of claim 3, wherein each of the holes have an effective diameter that is 1–10 mils greater than the diameter of the joining units.

5. An assembly as claimed in claim 2, wherein each said joining unit has a bulbous portion having a relatively large diameter and a waist region with a relatively small diameter, wherein the waist region is disposed in engagement with the dielectric element and the bulbous portion is disposed below the dielectric element.

6. An assembly as claimed in claim 2, wherein each of the electrically conductive joining units is a solder ball.

7. An assembly as claimed in claim 2, wherein each of the electrically conductive joining units is a bumped lead.

8. The socket of claim 1, wherein the flexible dielectric element is comprised of polyimide.

9. The socket of claim 1, wherein the backing element is comprised of a material selected from the group consisting of fiberglass reinforced epoxies and polyimides.

10. The socket of claim 1, further comprising a plurality of electrically conductive posts disposed on the second surface of the backing element, wherein said posts are electrically connected to said contacts, said posts defining substrate connections for connecting said contacts to an external substrate.

11. The socket of claim 10, wherein each post is a solid core solder ball.

12. The socket of claim 11, wherein said solid core solder balls are connected to the electrically conductive contacts.

13. The socket of claim 1, wherein the plurality of electrically conductive contacts are disposed on the second surface of the backing element.

14. The socket of claim 1, wherein the flexible dielectric element includes at least one relief zone adjacent each aperture for facilitating the deflection of the lip region when an electrically conductive joining unit is pressed against such aperture.

15. The socket of claim 1, wherein the apertures of the flexible dielectric element are defined by finger-like projections which extend radially.

16. The socket of claim 15, wherein each of the projections defining an aperture has a tip, and each of the tips extend inwardly towards a common center.

17. The socket of claim 1, wherein each of the central openings is co-extensive with one of the apertures.

18. The socket of claim 1, wherein each contact has a circular shape.

19. The socket of claim 1, wherein the geometric centers of each hole and the opening disposed under such hole is aligned.

20. The socket of claim 19, wherein the geometric centers of each hole and associated aperture are aligned.

21. The socket of claim 1, wherein the lip of each aperture has a first orientation before an electrically conductive joining unit penetrates through such aperture, a second orientation when such joining unit penetrates through such aperture and a third orientation after such joining unit penetrates through such aperture, wherein the first orientation is undeflected, the second orientation is deflected inwardly, and the third orientation is undeflected.

22. The socket of claim 1, further comprising a plurality of spacers disposed on the second surface of the backing element.

23. The socket of claim 22, wherein each of the spacers is comprised of a compliant non-conductive material.

24. The socket of claim 22, further comprising a sheet disposed between the backing element and the external substrate, said sheet having a plurality of voids, each of said voids being aligned with one of the holes.

25. The socket of claim 24, wherein the sheet is comprised of a compliant, non-conductive material.

26. A socket for use in making connection with a semiconductor chip assembly having a plurality of electrically conductive joining units connected thereto, said socket comprising:

A. a flexible dielectric element having a top surface and a bottom surface opposite the top surface and a plurality of apertures extending from the top surface to the bottom surface and a lip region surrounding each of the apertures; and B. a backing element having a first surface, a second surface opposite the first surface and a plurality of holes extending from the first surface to the second surface, said backing element being disposed beneath the flexible dielectric element such that the first surface faces towards the bottom surface of the flexible dielectric element; and wherein each of the holes is disposed under one of the apertures in the flexible dielectric element and has an effective diameter which is greater than the effective diameter of the aligned aperture, such that the lip region surrounding each aperture overlies the hole in the backing element associated with such aperture;

wherein the lip regions of said dielectric element surrounding each of said apertures is deflectable to the extent necessary to allow an electrically conductive joining unit having a diameter larger than the effective diameter of the aperture to penetrate through the aperture and to capture such electrically conductive joining unit after it has penetrated the aperture.

27. An assembly, comprising:

the socket of claim 26;

a circuitized substrate having a plurality of electrically conductive contacts wherein each of the contacts is adapted to make an electrical interconnection to one of the electrically conductive joining units when such electrically conductive joining unit is inserted into one of the apertures.

28. The assembly of claim 27, further comprising a semiconductor chip assembly having a plurality of electrically conductive joining units.

29. The assembly of claim 28, wherein the electrically conductive joining units are solder balls.

30. The assembly of claim 27, further comprising a plurality of spacers disposed between the second surface of the backing element and the circuitized substrate.

31. The socket of claim 26, wherein the flexible dielectric element includes at least one relief zone adjacent each aperture for facilitating the deflection of the lip region when an electrically conductive joining unit is pressed against such aperture.

32. The socket of claim 26, wherein the apertures of the flexible dielectric element are defined by finger-like projections which extend radially.

33. The socket of claim 32, wherein each of the projections defining an aperture has a tip, and each of the tips extend inwardly towards a common center.

34. The socket of claim 26, wherein the geometric centers of each hole and associated aperture are aligned.

35. The socket of claim 26, wherein the lip of each aperture has a first orientation before an electrically conductive joining unit penetrates through such aperture, a second orientation when such joining unit penetrates through such aperture and a third orientation after such joining unit penetrates through such aperture, wherein the first orientation is undeflected, the second orientation is deflected inwardly, and the third orientation is undeflected.

36. The assembly of claim 30, wherein each of the spacers comprises a compliant material.

37. The assembly of claim 30, wherein each of spacers is non-conductive.

38. The assembly of claim 27, further comprising a sheet disposed between the backing element and the external substrate, said sheet having a plurality of voids, each of said voids being aligned with one of the holes.

39. The assembly of claim 27, wherein the sheet is made of a compliant, non-conductive material.

* * * * *

UNITED STATES PATENT AND TRADEMARK OFFICE
CERTIFICATE OF CORRECTION

PATENT NO. : 6,126,455
DATED : October 3, 2000
INVENTOR(S) : Haba

It is certified that error appears in the above-identified patent and that said Letters Patent is hereby corrected as shown below:

Column 1, line 15, after "5,802,699" insert a comma.
Column 2, line 26, "wafer" should read -- wafers. --.
Column 3, line 59, "fingerlike" should read -- finger-like --.
Column 5, line 45, "it" should read -- its --.
Column 7, line 66, "cross sectional" should read -- cross-sectional --.
Column 8, line 59, "penetrates" should read -- penetrate --.
Column 9, line 6, "it" should read -- its --.
Column 9, line 7, cancel the word "is".
Column 9, line 16, after "thereof" insert a period.
Column 9, line 50, "in" should read --the --.
Column 10, line 15, after "testing" insert a comma.
Column 11, line 55, "centers" should read -- center --.
Column 12, line 35, "is" should read -- are --.
Column 14, line 1, after "of" insert -- the --.

Signed and Sealed this

Twenty-second Day of May, 2001

Attest:

NICHOLAS P. GODICI

*Attesting Officer*  Acting Director of the United States Patent and Trademark Office